(12) United States Patent
Lenniger et al.

(10) Patent No.: US 6,828,600 B2
(45) Date of Patent: Dec. 7, 2004

(54) POWER SEMICONDUCTOR MODULE WITH CERAMIC SUBSTRATE

(75) Inventors: Andreas Lenniger, Anröchte (DE); Gottfried Ferber, Warstein (DE); Alfred Kemper, Warstein (DE)

(73) Assignee: eupec Europaeische Gesellschaft fuer Leistungshalbleiter mbH, Warstein (DE)

( * ) Notice: Subject to any disclaimer, the term of this patent is extended or adjusted under 35 U.S.C. 154(b) by 0 days.

(21) Appl. No.: 10/429,605

(22) Filed: May 5, 2003

(65) Prior Publication Data

US 2003/0168724 A1 Sep. 11, 2003

Related U.S. Application Data

(63) Continuation-in-part of application No. 09/436,598, filed on Nov. 9, 1999, now abandoned, which is a continuation of application No. PCT/DE98/01266, filed on May 7, 1998.

(30) Foreign Application Priority Data

May 9, 1997 (DE) .......................................... 197 19 703

(51) Int. Cl.[7] .............................................. H01L 29/73
(52) U.S. Cl. ....................... 257/181; 257/690; 257/692; 257/693; 29/837; 29/845
(58) Field of Search ................................. 257/690, 692, 257/693, 502, 503, 181, 182; 29/837, 838, 845

(56) References Cited

U.S. PATENT DOCUMENTS

| | | |
|---|---|---|
| 4,849,803 A | 7/1989 | Yamamoto et al. |
| 4,897,602 A | 1/1990 | Lin et al. |
| 5,137,467 A | 8/1992 | Arai |
| 5,199,880 A | 4/1993 | Arai |
| 5,213,514 A | 5/1993 | Arai |
| 5,243,757 A | 9/1993 | Grabbe et al. |
| 5,408,128 A * | 4/1995 | Furnival ...................... 257/690 |
| 5,621,243 A * | 4/1997 | Baba et al. .................. 257/712 |
| 5,699,232 A * | 12/1997 | Neidig et al. ............... 361/752 |
| 5,753,971 A * | 5/1998 | Miller et al. ................ 257/690 |
| 5,920,119 A * | 7/1999 | Tamba et al. ............... 257/718 |
| 5,945,727 A | 8/1999 | Ishiwa |
| 6,045,393 A | 4/2000 | Alpert |
| 6,291,880 B1 * | 9/2001 | Ogawa et al. .............. 257/723 |
| 6,521,983 B1 * | 2/2003 | Yoshimatsu et al. ........ 257/678 |
| 6,638,099 B2 * | 10/2003 | Nakamura ................... 439/489 |

FOREIGN PATENT DOCUMENTS

| | | |
|---|---|---|
| DE | 36 04 313 A1 | 8/1987 |
| DE | 43 38 107 C1 | 3/1995 |
| EP | 0 438 165 A2 | 7/1991 |
| EP | 0 513 410 A1 | 11/1992 |
| FR | 2 660 826 | 10/1991 |

* cited by examiner

Primary Examiner—David Zarneke
Assistant Examiner—Thanh Y. Tran
(74) Attorney, Agent, or Firm—Laurence A. Greenberg; Werner H. Stemer; Gregory L. Mayback

(57) ABSTRACT

A power semiconductor module is presented in which terminal elements are press-fitted into openings in a plastic housing. This measure improves the reliability of the internal bonds between the substrate and the terminal element since there is no longer a risk of the terminal elements loosening in the plastic housing.

4 Claims, 2 Drawing Sheets

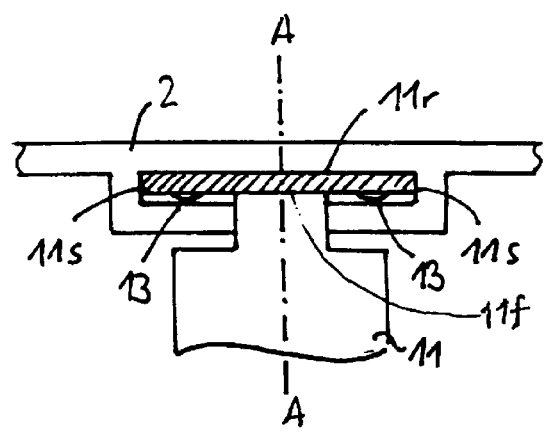
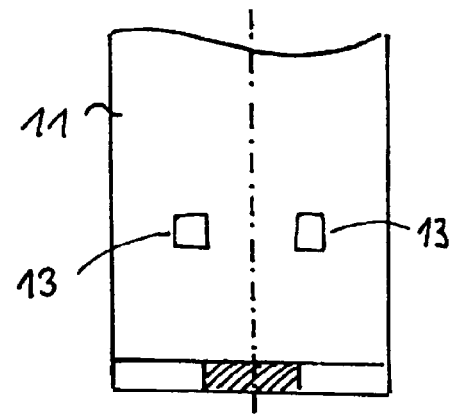
FIG 4
FIG 5
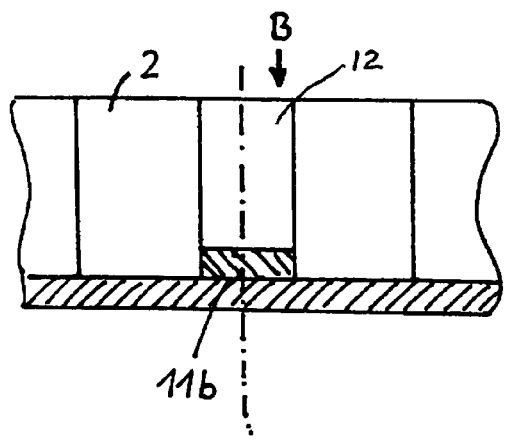
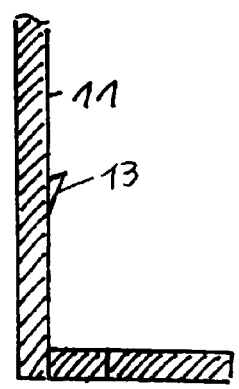
FIG 6
FIG 7

POWER SEMICONDUCTOR MODULE WITH CERAMIC SUBSTRATE

CROSS-REFERENCE TO RELATED APPLICATION

This is a continuation-in-part of application Ser. No. 09/436,598, filed Nov. 9, 1999 now abandoned, which was a continuation of International Application PCT/DE98/01266, filed May 7, 1998, which designated the United States and was not published in English.

BACKGROUND OF THE INVENTION

1. Field of the Invention

The invention relates to a power semiconductor module with a plastic housing into which a substrate is inserted as a housing base. The substrate contains a ceramic plate provided with a metallization layer on top and bottom sides. The metallization layer on the top side of the ceramic plate faces an interior of the housing and is patterned in order to form interconnects. The power semiconductor module is equipped with semiconductor components and connecting elements, and in which terminal elements for external terminals are introduced.

Such power semiconductor modules have been known for a long time. In the case of these power semiconductor modules, the terminal elements for the external terminals are disposed in the plastic housing. In this case, the terminal elements, which are composed of copper as a rule, are injection-molded into the plastic housing. However, plastic has the property of shrinking when it cools, in other words after the injection molding. The result of this is that the terminal elements are not, as a rule, anchored fixedly in the plastic. Wires are bonded onto the terminal elements in the interior of the housing, the other end of which wires is bonded onto the semiconductor components. These wires are composed of aluminum as a rule. By virtue of the fact that the plastic shrinks after the injection molding, however, it can happen that, owing to the poor mechanical fixing of the terminal elements in the plastic housing, the bond present in the interior of the housing may become detached. This leads to the failure of the power semiconductor module.

SUMMARY OF THE INVENTION

It is accordingly an object of the invention to provide a power semiconductor module with a ceramic substrate that overcomes the above-mentioned disadvantages of the prior art devices of this general type, which exhibits very good mechanical fixing of the terminal elements, with the result that the above-mentioned problems do not arise. Furthermore, the object of the present invention is to further simplify the method for producing the plastic housing.

With the foregoing and other objects in view there is provided, in accordance with the invention, a power semiconductor module, including semiconductor components and connecting elements.

A plastic housing has a frame and a cover. The frame is formed with an interior and openings surrounding the interior. The openings have a flat side remote from the interior and an inner side adjacent the interior.

A substrate disposed in the plastic housing defines a housing base of the plastic housing. The substrate contains a ceramic plate having a top side and a bottom side with a top metallization layer disposed on the top side and a bottom metallization layer disposed on the bottom side. The top metallization layer facing the interior of the frame is patterned in order to form conductive interconnects and is equipped for receiving the semiconductor components and the connecting elements.

Terminal elements in the plastic housing for providing external terminals have a flat rear side, a bottom side, two lateral sides and a front side with lugs. The terminal elements in the region of the lugs are press-fitted into the openings in the frame. The rear side of the terminal elements bears on the flat side of the openings. The lugs press against the inner side of the openings for fixing the terminal elements in position.

The connecting elements are bonded to the terminal elements and to the semiconductor components.

This object is achieved according to the invention by virtue of the fact that the terminal elements are press-fitted into openings in the plastic housing.

As a result of this measure, the metal parts are fixed into the plastic housing by a relatively simple method. In particular, this method does not need a separate injection mold into which the terminal elements are placed before each injection-molding process and subsequently encapsulated by the injection molding.

Furthermore, as a result of the terminal elements being press-fitted into the openings in the plastic housing, the elements are anchored considerably better therein, thereby enabling reliable bonds in the interior of the housing.

The lugs of the terminal elements are preferably configured as barbs, with the result that the terminal elements are guided tightly in the openings and secured from withdrawal. It is also conceivable for the terminal elements to be provided with offsets that fix the terminal elements in the openings.

The terminal elements expediently have regions in the interior of the housing which run approximately parallel to the housing base. This considerably facilitates the bonding process.

The substrate is covered, within the housing, with a potting compound that serves to encapsulate the substrate in a moisture-tight manner.

Other features which are considered as characteristic for the invention are set forth in the appended claims.

Although the invention is illustrated and described herein as embodied in a power semiconductor module with a ceramic substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is an enlarged, partial top view showing the assembled condition of the frame and the terminal element;

FIG. 5 is an enlarged, partial side view of a terminal element with lugs;

FIG. 6 is an enlarged, partial side view showing the frame with an opening for the terminal element; and FIG. 7 is an enlarged, partial, sectional view of a terminal element.

DESCRIPTION OF THE PREFERRED EMBODIMENTS

Figure 1:
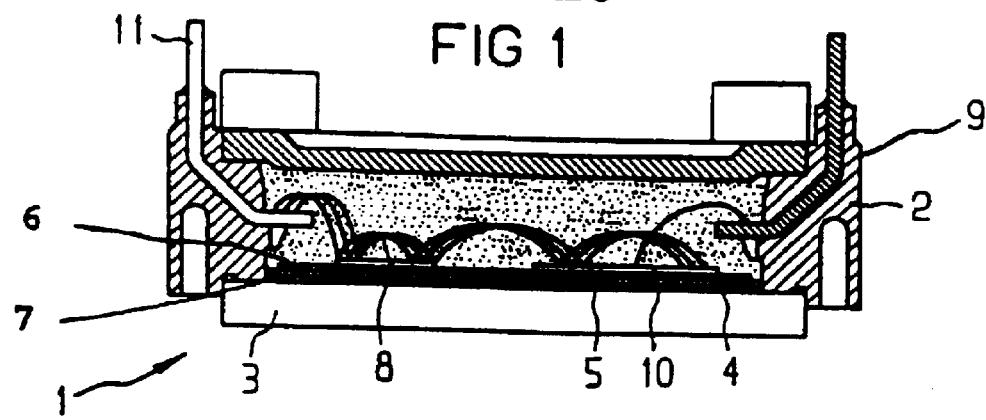
FIG. 1 is a diagrammatic, cross-sectional view through a power semiconductor module according to the prior art.

In all the figures of the drawing, sub-features and integral parts that correspond to one another bear the same reference symbol in each case. Referring now to the figures of the drawing in detail and first, particularly, to FIG. 1 thereof, there is shown a power semiconductor module 1 containing a plastic housing 9 formed of a frame 2 and a cover (not shown in FIG. 1), into which a substrate 4 is inserted as a housing base 3.

The substrate 4 contains a ceramic plate 5 provided with a metallization layer on its top side 6 and on its bottom side 7. The metallization layer on the top side 6 faces the interior of the frame 2 and is patterned to form interconnects. Semiconductor components 10 are applied on the top side 6 of the ceramic plate 5. The semiconductor components 10 are, as a rule, power semiconductor components such as IGBTs, MCTs, power transistors or power diodes. Furthermore, connecting elements 8 configured as aluminum wires are situated there. The connecting elements 8 are applied on the semiconductor components 10 by bonding methods.

Terminal elements 11 for external terminals are injection-molded into the frame 2 according to the prior art. In this case, the terminal elements 11 are injection-molded into the frame 2, which is composed of plastic, using a separate injection mold. The relevant terminal element is placed into the injection mold before each injection-molding process and is subsequently encapsulated by injection molding.

Figure 2:
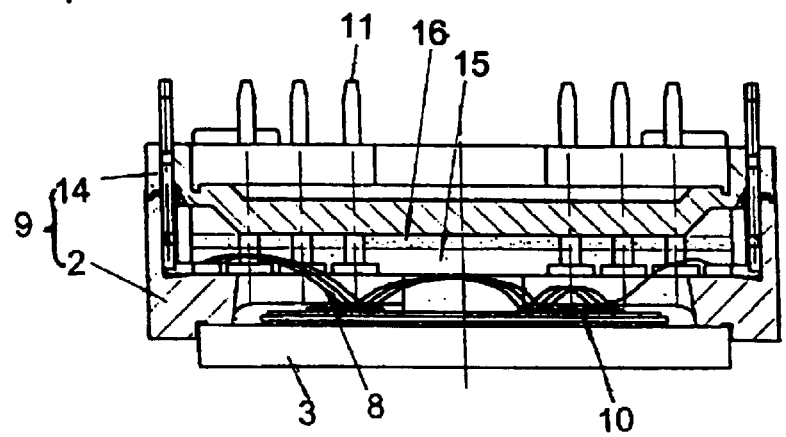
FIG. 2 is a cross-sectional view through a power semiconductor module according to the present invention.
Figure 3:
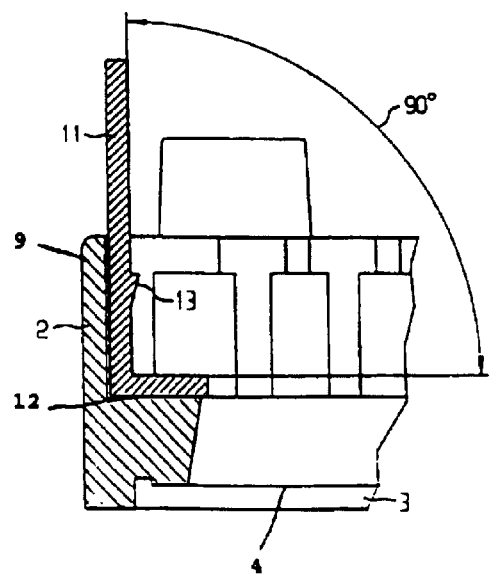
FIG. 3 is an enlarged, partial, sectional view of a frame of a plastic housing according to the invention.

FIGS. 2 and 3 show a plastic housing according to the present invention, in which the terminal elements 11 are press-fitted into openings 12 formed in the frame 2. The plastic housing 9 shown herein includes the frame 2 and the cover 14. The frame is formed with an interior and the openings 12 are formed surrounding the interior. The openings have a flat side remote from the interior and an inner side adjacent the interior. The terminal elements 11 in this case have lugs 13, which bear on the inner side of the openings 12. The terminal elements 11 are thereby fixed in their position. The lugs 13 have the function of barbs that secure the terminal elements 11 against unintentional withdrawal. The bonds between the terminal elements 11 and the semiconductor components 10 and/or connecting elements 8 are thereby secured against destruction.

The terminal elements 11 run approximately parallel to the housing base 3 in the interior of the frame 2. The substrate 4 is covered with a potting compound. The potting compound is formed of a hard potting compound layer 16 disposed on a soft potting compound layer 15.

The present invention will now be described in more detail with reference to FIGS. 4–7. Two factors in combination with each other play an important role for the present invention. It is an important aspect that the rear side 11r of the terminal element 11 bears flat especially on the flat side of the openings ensuring a solid fit. Furthermore, the openings guide the terminal element 11 at the bottom side 11b as well as lateral sides 11s.

In addition, a guide in a specifically embodied frame 2 is also ensured at the front side of the terminal element 11, i.e. towards the interior of the housing in that lugs 13 press against the corresponding parts of the frame 2, namely the inner side of the opening 12. By inserting the terminal element 11 into the opening 12 of the frame in the direction B (see FIG. 6), the lugs 13 are pressed against the corresponding locations of the frame 2, namely the inner side of the openings 12, so that the rear side of the terminal element 11 is pressed from the inside against the flat side of the openings 12.

FIG. 4 shows the assembled condition of the frame of the terminal element, while FIG. 6 shows the frame 2 and FIGS. 5 and 7 show the terminal element 11. FIG. 2 results from FIG. 4 by cutting along section line A—A.

It is only the extremely solid fit of the terminal element 11 in the frame 2 which makes it possible to apply bonding connections. If the terminal element 11 sits relatively loosely in the frame 2, the terminal element 11 could be ripped away during the bonding when the bonding tools are taken away, because a certain tractive effect is present due to the attachment of the bonding wire. The terminal element 11 would then at least sit relatively loosely in the housing so that during operation, especially when contacts are plugged onto the terminal element, the bonding connection would be destroyed.

The terminal element 11 has a rear side 11r bearing flat on the flat side of the openings 12 of the frame 2. As shown in FIG. 4, the terminal element 11 is guided in five directions by the frame 2, namely at the rear side 11r by the flat side of the opening 12, at the front side 11f by the inner side of the opening 12, at bottom side 11b and at two lateral sides 11s. It is to be pointed out that an additional pulling out in upward direction would indeed be possible and that in reality it is prevented by additional measures, which are not a part of the present invention.

The fixing is created by the lugs 13 after they are inserted (in direction B) perpendicular to the interior of the frame 2 and thus ensure a solid fit. The above-mentioned measures serve the purpose of ensuring a safer bonding.

We claim:

1. A power semiconductor module, comprising:

semiconductor components and connecting elements;

a plastic housing having a frame and a cover, said frame being formed with an interior and openings surrounding said interior, said openings having a flat side remote from said interior and an inner side adjacent said interior;

a substrate disposed in said plastic housing defining a housing base of said plastic housing, said substrate containing a ceramic plate having a top side and a bottom side with a top metallization layer disposed on said top side and a bottom metallization layer disposed on said bottom side, said top metallization layer facing said interior of said frame being patterned to form conductive interconnects and equipped for receiving said semiconductor components and said connecting elements; terminal elements in said plastic housing for providing external terminals, said terminal elements having a flat rear side, a bottom side, two lateral sides and a front side with lugs, said terminal elements in the region of said lugs being press-fitted into said openings in said frame, said rear side of said terminal elements bearing on said flat side of said openings, and said lugs pressing against said inner side of said openings for fixing said terminal elements in position; and said connecting elements being wire-bonded to said terminal elements and to said semiconductor components.

2. The power semiconductor module according to claim 1, wherein said terminal elements run approximately parallel to said housing base in said interior of said frame.

3. The power semiconductor module according to claim 1, wherein said substrate is covered with a potting compound.

4. The power semiconductor module according to claim 3, wherein said potting compound is formed of a soft potting compound layer and a hard potting compound layer disposed on said soft potting compound layer.

* * * * *